United States Patent [19]

Schierz

[11] 3,918,084

[45] Nov. 4, 1975

[54] SEMICONDUCTOR RECTIFIER ARRANGEMENT

[75] Inventor: Winfried Schierz, Roth, Germany

[73] Assignee: SEMIKRON Gesellschaft fur Gleichrichterbau und Elektronik m.b.H., Nuremberg, Germany

[22] Filed: Nov. 19, 1974

[21] Appl. No.: 525,313

[52] U.S. Cl. .......... 357/82; 165/80

[51] Int. Cl.² .......... H01L 25/04

[58] Field of Search .......... 357/82; 165/80

[56] References Cited

FOREIGN PATENTS OR APPLICATIONS 796,763 6/1958 United Kingdom .......... 165/80

*Primary Examiner*—James B. Mullins

*Attorney, Agent, or Firm*—Spencer & Kaye

[57] ABSTRACT

A semiconductor rectifier arrangement in which two rectifier wafers, at least one of which is controllable, are fastened to a cooling element which is provided with a through-opening for the passage of a coolant, i.e., a cooling channel. The cooling element comprises a flat metal base plate and a flat cover of an insulating material with good thermal conductivity which is fastened to the base plate. One of the two components of the cooling element is provided with a recess in the surface facing in the other component so as to form a cavity which is enclosed by both components and constitutes the cooling channel, and is additionally provided with connecting studs for the coolant lines. At least one areal section on the cover is provided at a small distance from the cooling channel and is covered with a metal intermediate layer which is subdivided into a plurality of layer portions and which is suitable for fastening the rectifier wafers. Each of the rectifier wafers is mounted on and permanently attached to one of said metal layer portions and has its upper connecting lead contacted by a conductor which is disposed on the adjacent metal layer portion. The structure including the cooling element, the rectifiers and the conductors are encapsulated in a mass of insulating material.

8 Claims, 4 Drawing Figures

SEMICONDUCTOR RECTIFIER ARRANGEMENT

BACKGROUND OF THE INVENTION

The present invention relates to a semiconductor rectifier arrangement in which two rectifier elements, of which at least one is controllable, are fastened to a cooling component which is provided with a through-opening for the passage of a coolant and are electrically connected together to form a rectifier circuit.

With the application of an alternating voltage signal, controllable semiconductor devices called thyristors are known to be capable of being switched from the nonconductive to the conductive state at any desired point in time during the halfwave of the signal which charges the device in the forward direction by means of a control pulse applied to the control electrode. They thus constitute contactless switches. Due to this advantageous property and further known advantages, thyristors are being increasingly used to switch and control high currents, for example in the welding art, as so-called a.c. switches.

In such known arrangements, disc-shaped thyristors are provided with cooling elements for fluid cooling so that a space saving structure and high current carrying capability are assured. The assembly of such arrangements is complicated, however, because these thyristor components require a cooling element on each contact surface in order to approximately uniformly dissipate the resulting heat at both contact surfaces and because the cooling elements must be assembled so that they are electrically insulated from one another. Moreover, the hoses provided for the intake and outlet of the coolant, which is preferably tap water, have a considerable length between the cooling elements of such known arrangements during use because of the varying potentials of the different cooling elements and because of the more than negligible conductance of the coolant. With an a.c. terminal voltage of 500 $V_{eff.}$ and with an operating temperature of the coolant of about 60°C and with the requirement that the heat loss produced in the coolant in the hoses where it acts as a parallel resistance be only a few Watts, a hose length between the cooling elements of about 50 cm results when tap water is used.

Finally, in the known arrangements the rectifier elements are connected with the cooling components via special contacting elements. Thus the distance of the rectifier wafers from the cooling medium and thus the path which the dissipated heat must travel to reach the coolant is relatively long and thus the optimum current carrying capability is not assured.

Embodiments have now been proposed in which in order to optimize the dissipation of the heat, the housing portion which accommodates the rectifier water simultaneously is formed as the cooling element and is provided in its interior with a channel for the passage of the coolant so that the coolant passes as close as possible to the rectifier wafer. This does improve the operating behavior of such rectifier arrangements, but the drawbacks of the resulting longer external coolant lines still exist.

SUMMARY OF THE INVENTION

It is the object of the present invention to provide a rectifier arrangement having two semiconductor rectifier elements which are connected together to form a rectifier circuit and which are fastened on a cooling element wherein the rectifier wafer is optimally cooled and the cooling elements are arranged to be free of potential.

The above object is accomplished according to the present invention in that the cooling element for the two semiconductor rectifier wafers is made of a flat metal basic body having a flat cover of an insulating material with good thermal conductivity, one of the two components of the cooling element being provided on its surface facing and abutting the other component with a recess design forming a cavity which is enclosed by the surfaces of both components and serves as the cooling channel, and one of the two components being provided with hollow studs, which are in communication with the cooling channel, for the connection of the external coolant lines; at least one areal section of the cover is disposed at a small distance from the cooling channel and is provided with a subdivided metal intermediate layer which is suitable to be fastened to the rectifier wafer; each rectifier wafer is permanently attached, without being encapsulated, to one of the metal intermediate layer portions and has its upper connecting lead contacted by a current conducting element which is fastened to the adjacent metal layer portion; and the assembly including the cooling element, the rectifier wafers and the current conductor elements is encapsulated in an insulating mass.

DETAILED DESCRIPTION OF THE PREFERRED EMBODIMENTS

Figure 1:
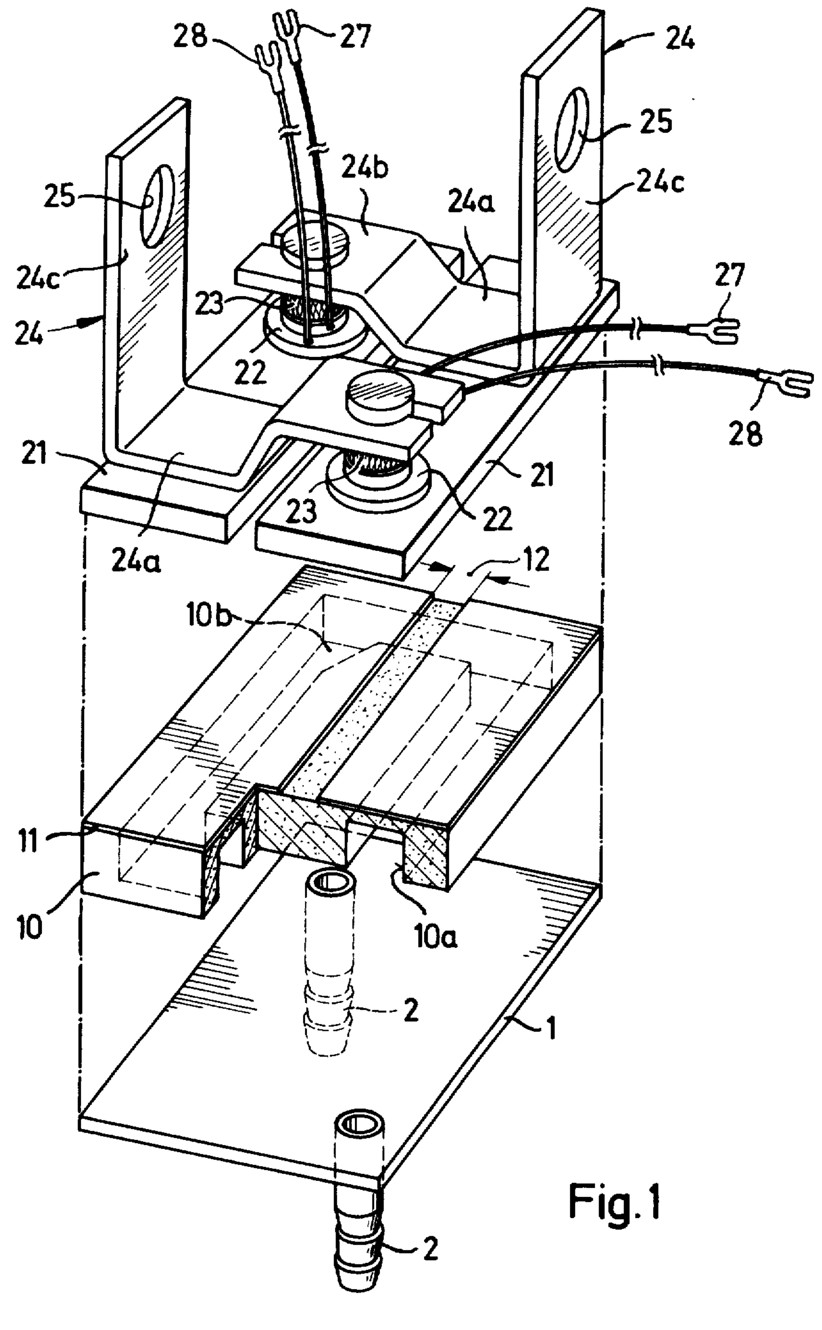
FIG. 1 is a perspective view of the significant components of an arrangement according to the present invention in the form of an antiparallel connection of two thyristors in a mutual association which corresponds to their type of assembly.

In all drawing figures the same parts bear the same reference numerals.

Referring now to FIG. 1 there is shown the basic components of one embodiment of a semiconductor arrangement according to the invention. As shown in FIG. 1 a metallic base plate 1, which constitutes the basic element of a cooling element, has two hollow tubular parts 2 attached to its underside or lower surface and extending perpendicularly thereto. The two tubular parts 2 which will hereinafter be called the connecting studs 2, extend to the upper surface of the plate 1 and serve for the attachment of conventional hoses for the liquid coolant. A disc-shaped element 10 is provided as the cover for the cooling element and preferably is made of an oxide ceramic. The cover 10 is provided on its surface which is intended to abut and be connected to the base plate 1 with a groove-type, closed, rectangular recess 10*a*, which when the plate 1 and cover 10 are fastened together form the coolant channel. The cover 10 is fastened to the base plate 1 at the edge zone of the abutting surfaces, for example by gluing or soldering, via a layer of metal. In the illustrated embodiment the base plate 1 may have a larger areal extent than the cover 10 and, if required, may be provided at its protruding edge zone with bores through which it can be fastened to a support (not shown).

For an optimum heat dissipation of the heat produced, during operation, in the rectifier wafers which are fastened to the top or upper surface of the cover 10, the entire volume of the coolant circulating in the coolant channel must, if possible, participate in the dissipation of heat. Consequently, a turbulent flow is necessary in the cooling channel. Such a turbulent flow can be realized by suitably designing the cooling channel in a manner well known in the art.

The hollow connecting studs 2 are disposed in the base plate 1 so that they are located at diagonal corners in the path of the cooling channel 10*a* where a rectifier element is fastened to the cover 10 via metallic intermediate layers. In order to collect coolant and thus improve the dissipation of heat at the location of the rectifier elements, as shown in FIG. 1, the cooling channel 10*a* is provided with a greater inner diameter 10*b* at the diagonal corners.

The surface of cover 10 which faces away from base plate 1, i.e., the upper surface, is provided with two strip-shaped metallized portions 11 which are parallel to one another at a mutual spacing 12. A pair of contact plates 21 of a material having good electrical and thermal conductivity, for example copper, are fastened to the cover 10, for example by soldering, via the respective metallized strips 11 in order to improve the thermal operating behavior of the arrangement. The two contact plates 21 serve as carrier plates and conduct the current for the illustrated antiparallel connection of two rectifier wafers disposed thereon. Each contact plate 21 accommodates, on one-half of its exposed surface, a rectifier wafer 22 which has one contact soldered thereto and on the other half a respective strip-shaped conductor 24 which extends transverse to the longitudinal axis of the respective contact plate 21. The opposite or upper contact surface of each of the semiconductor wafers is connected to a respective flexible connecting lead 23. In the case of a pair of thyristors as illustrated, each semiconductor rectifier wafer is additionally provided with a control electrode lead 28 and possibly an auxiliary cathode electrode lead 27.

The center section 24*a* of each conductor 24 is areally connected with the associated contact plate 21 and the section 24*b* in the direction of the other contact plate 21 is brought, for example by bending, adjacent the respective upper lead 23 on the upper terminal of the respective rectifier wafer 22 on the other contact plate 21 and is fastened to the lead 23. The remaining free end 24*c* of each conductor 24 is bent perpendicular to the respective contact plate 21 and simultaneously serves, by means of a respective bore 25, as the external connections for the entire arrangement.

The areal expanse of each contact plate 21 depends on the contact surface of the rectifier wafer 22 and on that of the section 24*a* of conductor 24 which is likewise fastened thereto and is uncritical with respect to its intended spatial arrangement on the cooling element. The areal expanse of of the cover 10 is consequently at least equal to that of the two contact plates 21 and the insulation space 12 required therebetween, so that the area formed and enclosed by the cooling channel 10*a* is almost covered by the contact plates 21 on the side where they are disposed.

The quantity of circulating coolant must assure that the difference in temperature remains constant between the side of the cooling element where the rectifier wafers are disposed and the side covered by the coolant.

The galvanic connection of the upper lead 23 of each rectifier wafer 22 with the adjacent contact plate 21 via the respective conductor 24 and the resulting thermal coupling to cover 10 of the cooling element favors the dissipation of the heat from each rectifier wafer.

Although the conductors 24 preferably are of the general shape illustrated it is to be understood that other arrangements are possible. For example, the conductor section 24*c* may be designed to be four-sided (i.e., have a square cross section), may be fastened with its frontal face to the contact plate 21 and may be connected, for example, with the respective lead 23, which additionally may be a rigid upper terminal of the rectifier wafer 22, via a flexible metal band, preferably of copper, which is fastened to one longitudinal side of the square conductor section 24*c*. Alternatively section 24*b* of the illustrated conductor may be fastened to the frontal face of the respective lead 23 for example by means of soldering or screwing, or conductor section 24*c* of the illustrated conductor may be provided in the form of stranded cables with a connecting lug at the end.

The metallic base plate 1 may be provided, if desired, with a corrosion resistant protective layer on its surface facing and abutting the cover 10.

Figure 2:
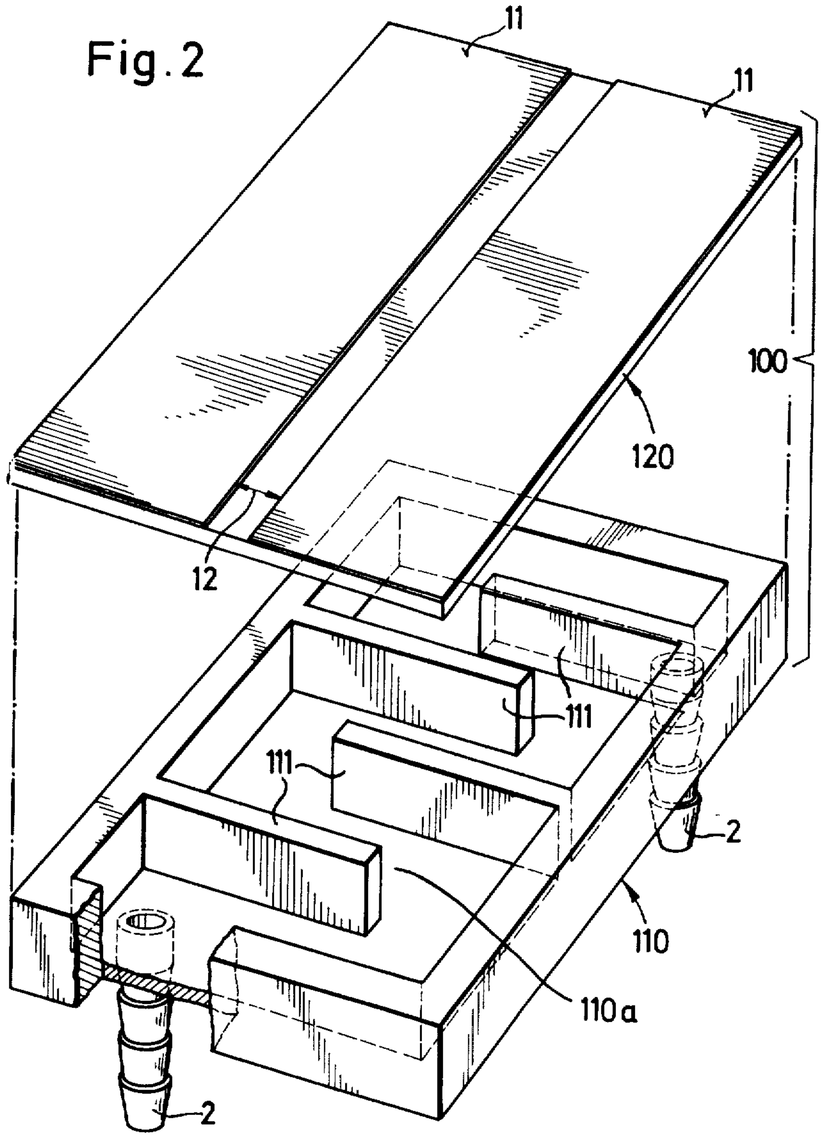
FIG. 2 is a perspective view of another embodiment of a cooling element for the arrangement according to the invention.

The modified cooling element 100 shown in FIG. 2 comprises a trough-shaped metallic base body 110 having a rectangular shape. Partitions 111 which extend from both longitudinal sides into the interior of the trough in alternating arrangement while resting on the bottom of the trough serve as barriers for the coolant and thus form a meander-shaped cooling channel 110*a* in the base element 110. A pair of hollow connecting studs 2 which pass through the bottom of the plate and protrude from its underside open into the ends of this cooling channel.

In order to produce a cooling element which is closed on all sides, the trough-shaped base 110 is provided with a thin cover 120 of an oxide ceramic which may be fastened to the base at its edge zone which faces and abuts the base by gluing or via a metallization by soldering. The free top surface of the cover 120 is provided with metal portions 11 spaced according to the design of the cover 10 shown in FIG. 1.

Since during operation of the arrangements according to the present invention, the base 110 is at ground potential and the metal portions 11 are at a different potential which is determined by the momentary value of the operating voltage, in this embodiment the cover 120 preferably is provided with a larger areal expanse as compared to base 110 and protrudes between base 110 and metal portions 11 on all sides beyond base 110 in order to assure the sufficient electrical insulation spacing between base 110 and metal portions 11.

In order to show the entrance of the hollow connecting stud 2 into the cooling channel 110 a section of the enclosure is cut out at a suitable point in the drawing.

Figure 3:
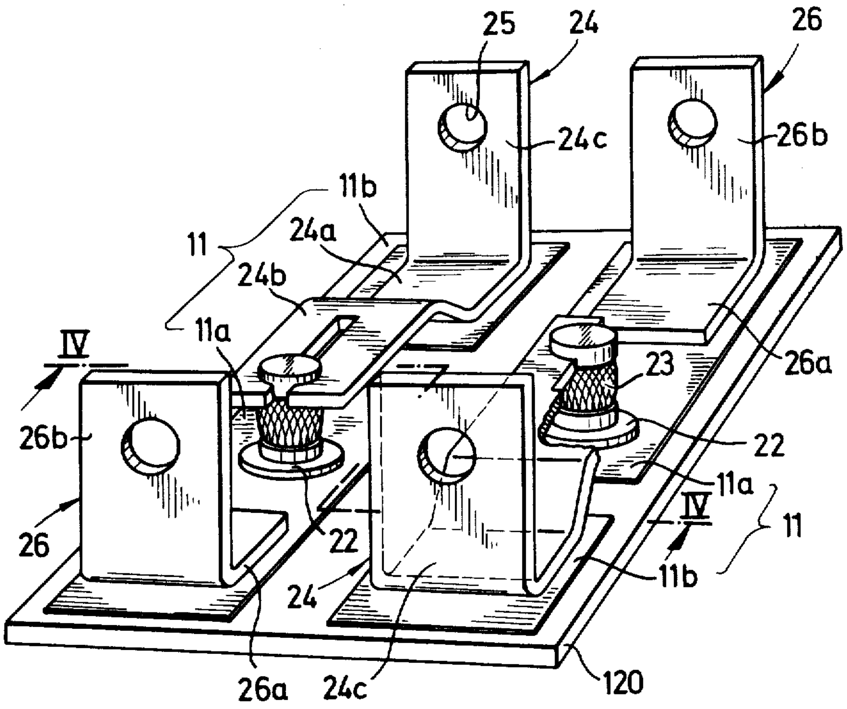
FIG. 3 is a perspective view of an assembly of two rectifier elements on a carrier plate with separately provided connecting leads for the production of any desired electrical circuit.

FIG. 3 shows another embodiment of the present invention. The cover 120 of an oxide ceramic is provided with two strip-shaped metal portions 11 which are each subdivided to include a section 11*a* and a separate section 11*b*. Both sections of each metal portion 11 together support a rectifier system including a rectifier wafer 22 and two conductors 24 and 26 connected thereto. In contradistinction to the embodiment shown in FIG. 1, the two metal layer portions 11 are not each bridged by a part of a conductor. Both rectifier systems are arranged oppositely to one another with respect to their spatial arrangement. Each rectifier wafer 22 is fastened to a section 11*a* of a respective metal layer portion 11 adjacent to the associated section 11*b*. The upper lead 23 of the wafer 22 is connected, in the manner shown in FIG. 1, to a conductor 24 attached on the associated section 11*b*. Each section 11*a* also has permanently attached to it the conductor arm 26*a* of a conductor 26, which arm 26*a* constitutes the connection for the electrode of the rectifier wafer 22 which is fastened to the associated metal layer section 11*a* and which for this purpose is provided with a connecting arm 26*b* which passes to the outside of a housing.

In the illustrated embodiment each electrode of each rectifier wafer 22 has thus associated therewith a separate conductor 24 or 26 each so that it is possible, in an advantageous manner, to produce any desired rectifier connections of two individual semiconductor rectifiers. Thus when conductor section 24*c* of each rectifier system is connected to conductor section 26*b* of the other rectifier system, an antiparallel connection is produced. Alternatively, if the conductor section 24*c* of only one system is connected to conductor section 26*b* of the other system, a series connection or a one-half single-phase bridge connection results. Additionally, with open conductor sections 26*b* and the connection of conductor sections 24*c*, a center point connection is obtained and when conductor sections 24*c* are connected as well as conductor sections 26*b* the rectifier elements are connected in parallel.

Figure 4:
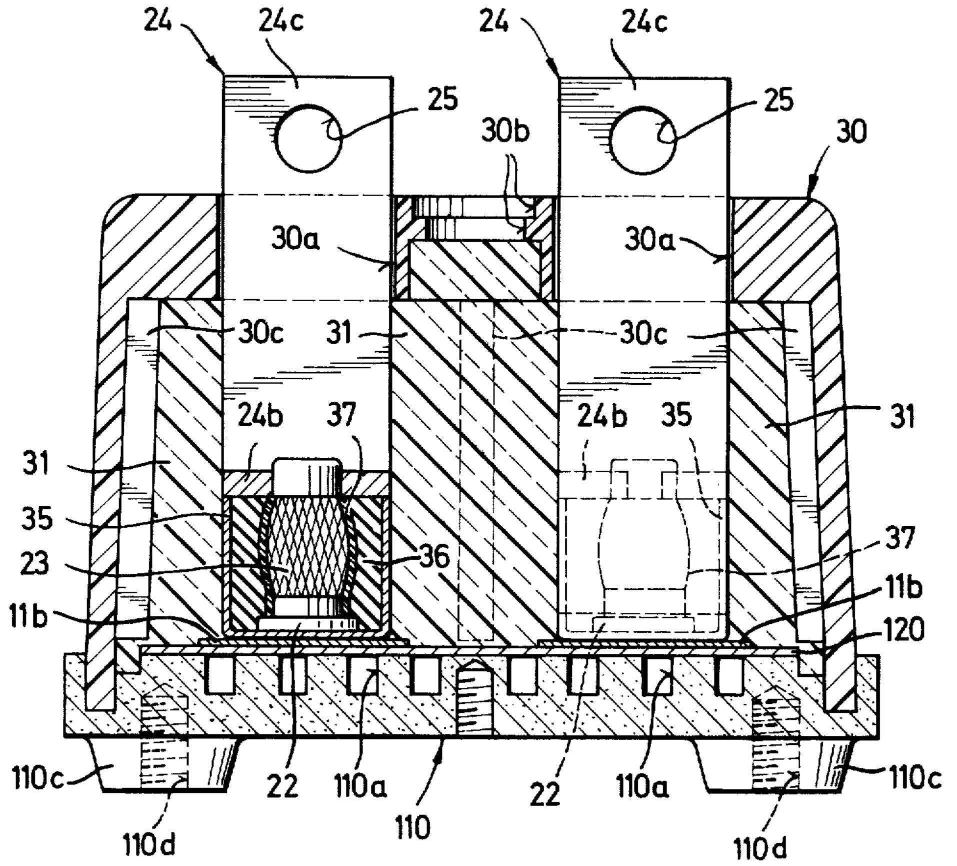
FIG. 4 is a cross-sectional view of the structure shown in FIG. 3 inside a housing.

FIG. 4 is a cross-sectional view in two mutually parallel planes of an embodiment as shown in FIG. 3 which is disposed in a housing. The cooling element provided for the circulating coolant includes, according to the embodiment of FIG. 2, a metal base 110 which includes a cooling channel 110*a* formed by a plurality of mutually parallel sections. Raised portions 110*c* with threaded bores (not shown) are provided at the free under surface of the base 110 for fastening of the arrangement to an instrument or chassis portion. The edge zone of the upper surface of the base 110 is provided with a groove-type recess for inserting the free edge zone of the cup-shaped upper housing portion 30. The hollow connecting studs 2 which are provided at the base 110 and which serve to connect coolant lines to the base, which here simultaneously serves as the lower housing portion, are not shown. The base 110 is covered by a cover 120 on which the rectifier systems are fastened. The upper housing portion 30 is provided with openings 30*a* for the conductor sections 24 and 26 (not shown) and with a central fill opening 30*b* for the encapsulating mass 31 in which the two rectifier systems are embedded. In order to avoid undesirable mechanical stresses on the rectifier wafer from the encapsulating mass 31 during manufacture and operation, each rectifier wafer 22 is preferably disposed in a cup-shaped metal part 35 and is connected therethrough to the respective metal layer portion 11. The metal part 35 is then filled with a silicone rubber 36 which protects the rectifier wafer 22 against external influences. The flexible portion of the upper connecting lead 23 for the wafer 22 is covered by a plastic hose 37 in order to prevent penetration of the rubber 36 into the cavities.

To increase the mechanical stability of the upper housing portion 30, which preferably is made of a pressed plastic mass, reinforcing vanes 30*c* are provided at its internal surfaces. Additionally, in order to further improve the heat dissipation from the rectifier wafer 22 through the cover 120 to the coolant, the inner surface of the cover 120 which is in communication with the coolant can be provided with a metallization having good heat conducting properties.

The arrangement according to the present invention can be produced in the following manner, for example. Base body 1 or 110, respectively, and cover 10 or 120, respectively, of the cooling element are initially prefabricated in the appropriate process steps and are then connected together at their associated edge zones by gluing, soldering or screwing, a high-temperature resistant seal being required in the case of a screw connection. Then the rectifier wafers 22 are soldered to the respective metal layer portions 11 on the upper surface of the cover or to respective contact plates 21 which were fastened to the metal layer portions 11 beforehand if required. Under consideration of the arrangement of rectifier wafers in a metal cup 35 as shown in FIG. 4 in order to embed them in a supporting plastic mass, the soldering processes of fastening the cup 35, which consists of thermally and electrically well conductive metal, to the metal layer portions 11 as well as fastening the rectifier wafer 22 to the inner bottom surface of the cup 35 and fastening the upper connecting lead 23 of the rectifier wafer 22, are advantageously effected simultaneously in a single process step. Prior to this soldering process the connecting lead 23 had been covered with the closely fitting plastic hose covering 37. After the soldering process, the conductor sections 24 are permanently connected in a further soldering step at a lower operating temperature to the respective metal layer portions 11 and on the free pressed end of the upper connecting lead 23. At the same time, in the case of the embodiment of FIG. 3, the further conductor sections 26 are likewise applied. Then the rectifier wafers — in the case of the embodiment of FIG. 4 — are embedded in silicone rubber 37 or some other protective mass which preferably simultaneously serves to stabilize the blocking property of the rectifier elements. Thereafter, a housing 30 which has been provided with recesses for the passage of the conductor sections 24, 26 and, which is particularly formed for engaging the base body 110 of the cooling component at its edge zone is pushed onto the base body 110. Finally, the housing 30 is filled with an encapsulating mass 31 and thus the arrangement is completed and constitutes a compact unit for the connection to other units to form the desired circuits.

The particular advantages of the present invention are an economically produceable configuration with a small number of components and a short manufacturing time, a universal field of application assured by the circulation of coolant without potential, and the economical assembly of any desired rectifier circuits with the desired electrical output in compact structures with optimum cooling of the rectifier elements at the highest permissible operating temperatures.

It will be understood that the above description of the present invention is susceptible to various modifications, changes and adaptations, and the same are intended to be comprehended within the meaning and range of equivalents of the appended claims.

1. A semiconductor rectifier arrangement comprising in combination: two semiconductor rectifier wafers, at least one of which is a controllable rectifier; a cooling element which is provided with a cooling channel for the passage of a liquid coolant and on which said rectifiers are mounted, said cooling element being formed of two components with one of said components being a flat metal base body and the other of said components being a flat cover of an insulating material with good thermal conductivity which is fastened to the upper surface of said base body; one of said components being provided, in the surface thereof which abutts the other of said components, with a recess which together with the adjacent surface of said other component forms said cooling channel; means formed in said base body and communicating with said cooling channel, for the connection of coolant lines to said cooling channel; an intermediate metal layer, which is subdivided into a plurality of layer portions, covering at least one areal section of the upper surface of said cover which is provided at a small distance from and overlies said cooling channel; each of said rectifier wafers being mounted on and having one contact surface thereof permanently electrically connected to one of said layer portions and having its opposite upper contact surface electrically connected to a conductor which is disposed on an adjacent one of said layer portions; and a mass of an insulating material incapsulating said conductors, said rectifier wafers and said cooling element.

2. A semiconductor rectifier arrangement as defined in claim 1 wherein said base body is a solid flat metal plate and said cover is provided on its surface facing said base body with a groove-shaped recess constituting said cooling channel.

3. A semiconductor rectifier arrangement as defined in claim 1 wherein said recess is formed in said base body.

4. A semiconductor rectifier arrangement as defined in claim 3 wherein said base body is trough-shaped with partitions extending from its oppositely disposed end walls alternatingly into the interior of said base body to form barriers for the coolant and wherein said cover is a planar, disc-shaped cover.

5. A semiconductor rectifier arrangement as defined in claim 1 wherein said cover is made of a cermaic oxide.

6. A semiconductor rectifier arrangement as defined in claim 1 further comprising a contact plate of an electrically and thermally good conducting metal disposed between and electrically connecting each of said rectifier wafers to its associated said metal layer portion.

7. A semiconductor rectifier arrangement as defined in claim 6 wherein said cover is provided on its surface which is in communication with the coolant with a metallization with good thermal conductivity.

8. A semiconductor rectifier arrangement as defined in claim 1 wherein said metal layer portions provided on the surface of said cover for fastening the rectifier wafers and the conductors are arranged in parallel strips, each of which is subdivided into two separate sections, and wherein one of said sections of each strip accommodates the rectifier wafer and a conductor provided for making connection to its electrode, and the other section of each strip accommodates the said conductor connected to the upper contact surface of the associated rectifier wafer.

* * * * *